(12) United States Patent
Self

(10) Patent No.: US 6,735,082 B2
(45) Date of Patent: May 11, 2004

(54) HEATSINK WITH IMPROVED HEAT DISSIPATION CAPABILITY

(75) Inventor: Bob J. Self, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/219,036

(22) Filed: Aug. 14, 2002

(65) Prior Publication Data

US 2004/0032718 A1 Feb. 19, 2004

(51) Int. Cl.[7] ................................................. H05K 7/20
(52) U.S. Cl. ..................... 361/703; 361/690; 361/704; 361/709; 361/719; 257/706; 257/722; 174/16.3; 165/80.3; 165/185
(58) Field of Search ..................... 361/704, 709, 361/719; 257/722; 174/16.3; 165/80.3

(56) References Cited

U.S. PATENT DOCUMENTS

| | | | |
|---|---|---|---|
| 4,352,008 A | * | 9/1982 | Hofer et al. ................. 219/540 |
| 4,920,574 A | | 4/1990 | Yamamoto et al. |
| 5,158,136 A | | 10/1992 | Azar |
| 5,195,576 A | | 3/1993 | Hatada et al. |
| 5,311,928 A | * | 5/1994 | Marton ....................... 165/80.3 |
| 5,406,451 A | | 4/1995 | Korinsky |
| 5,421,406 A | | 6/1995 | Furusawa et al. |
| 5,582,240 A | * | 12/1996 | Widmayer .................. 165/80.3 |
| 5,653,285 A | * | 8/1997 | Lee .............................. 165/185 |
| 5,763,950 A | * | 6/1998 | Fujisaki et al. .............. 257/712 |
| 5,818,694 A | * | 10/1998 | Daikoku et al. ............. 361/703 |
| 5,860,472 A | * | 1/1999 | Batchelder ................... 165/185 |
| 6,118,656 A | | 9/2000 | Wang |
| 6,173,758 B1 | | 1/2001 | Ward et al. |
| 6,273,186 B1 | | 8/2001 | Ognibene et al. |
| 6,308,771 B1 | * | 10/2001 | Tavassoli .................... 165/80.3 |
| 6,343,016 B1 | * | 1/2002 | Lin ............................. 361/704 |
| 6,446,707 B1 | | 9/2002 | White |
| 6,515,859 B2 | | 2/2003 | Roberts et al. |
| 6,578,626 B1 | | 6/2003 | Calaman et al. |
| 6,591,897 B1 | | 7/2003 | Bhatti et al. |

* cited by examiner

Primary Examiner—Boris Chervinsky

(57) ABSTRACT

A tandem heat sink operable to provide heat dissipation to one or more electronic components. The tandem heat sink apparatus creates air turbulence within the air stream across the one or more components through the use of pins oriented at more than one angle with respect to the base of the tandem heat sink. An airflow across one or more electronic components is disrupted by the geometry of the different pin angles of the tandem heat sink, thereby creating turbulence which increases the efficiency of the heat sink and prevents thermal shading from occurring. When the heat sink is placed on a single component, the heat sink may be situated without any overhang relative to the component due to the turbulence induced by the different pin angles and the resulting increase in heat dissipation efficiency.

9 Claims, 4 Drawing Sheets

HEATSINK WITH IMPROVED HEAT DISSIPATION CAPABILITY

TECHNICAL FIELD

This invention relates generally to the field of electronic devices and systems, and more specifically to heat dissipation in electronic devices.

BACKGROUND OF THE INVENTION

The ability of an electronic device to stay within a specified temperature region is directly related to the reliability and performance of the electronic device. Many electronic devices have strict temperature requirements for correct operation, and performance and lifetime are very sensitive to operation outside these temperature requirements. When an electronic component within a system overheats, often the entire electronic system is affected. There are many techniques available to help dissipate heat around an electronic component. Heat sinks are commonly employed in electronic systems where space is limited. Referring to FIG. 1, a simplified side view of a heat sink 100 is shown according to the prior art. Heat sink 100 is coupled to an electronic component 140 through the use of a heat sink/component interface 130. The interface 130 allows for a tight coupling between the heat sink 100 and the electronic component 140. The interface 130 is also coupled to a heat sink base 120. The heat sink base 120 acts as the primary conduction path for heat generated by electronic component 140. Heat sink base is coupled to a plethora of heat sink pins 110. The heat sink pins 110 provide several functions, including dissipation of heat generated by electronic component 140 and the creation of turbulence in the air flowing over the heat sink pins 110.

Pinned heat sinks are useful when applied in a staggered fashion where each device or component is in a different part of the airflow stream. However, when several heat sinks are placed in a line, forming a trough-shaped array, the airflow over the heat sinks tends to be uniform and the heat sinks ability to create turbulence is reduced. The propensity of the heat sinks to create thermal turbulence is critical, because turbulent airflow increases the efficiency of the heat sinks and effectively increases the heat dissipated around an electronic component. However, staggering of the heat sinks is not always a possibility due to electrical wiring lengths that have to be consistent. Moreover, orienting a heat sink in a staggered fashion may require that the heat sink hang over the edge of the component. This may not always be possible due to the geometry of the region surrounding the component.

SUMMARY OF THE INVENTION

The present invention discloses a structure for the dissipation of heat in the area around one or more electronic devices or components. Heat dissipation is achieved by the use of one or more heat sinks coupled to the one or more electronic components. The heat sinks contain a plurality of pins, where the pins associated with a particular heat sink may not be vertical, but instead are at an elevation angle relative to the base of the heat sink. The bases of the heat sinks may be rotated with respect to one another, where the rotation takes place in the plane containing the base of a particular heat sink. The net effect of the rotation of the bases of the heat sink and the elevation angle of the pins causes the flow of air across the surface of the pins to be disrupted. The increase in turbulent air flow over the heat sinks increases the efficiency of the heat sinks, providing a greater heat dissipation capability.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
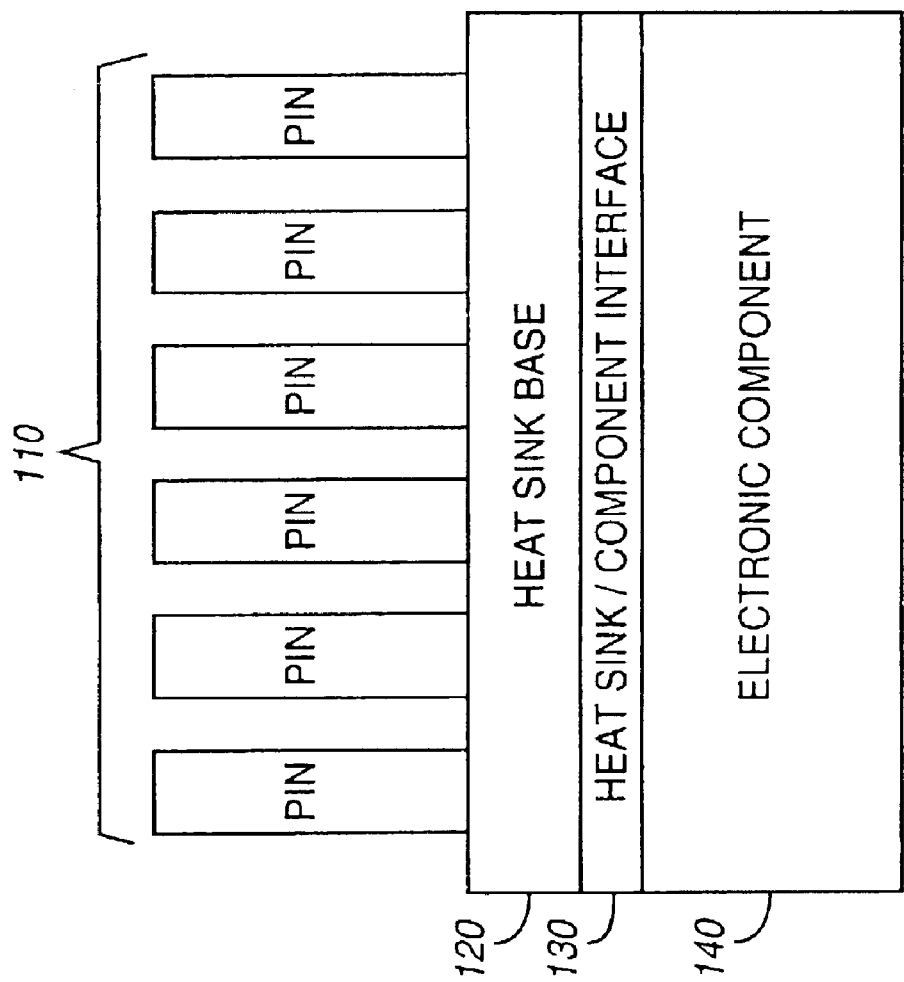
FIG. 1 is a side view of a heat sink, according to the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 2:
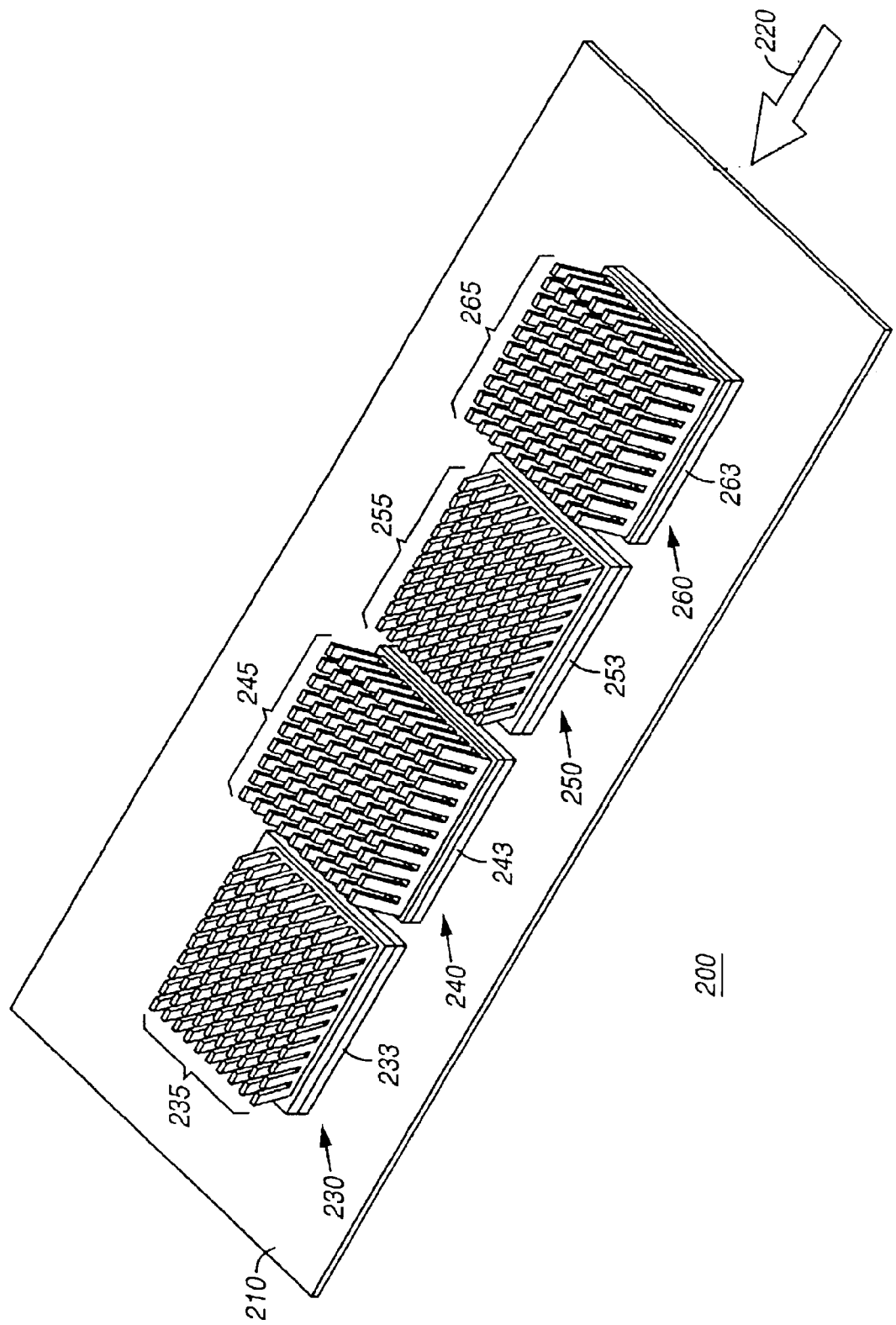
FIG. 2 is a structural diagram of several exemplary heat sinks, according to an embodiment of the present invention.

Referring now to FIG. 2, a structural diagram 200 of several exemplary heat sinks are shown, according to an embodiment of the present invention. Heat sinks 230, 240, 250, and 260 are coupled to printed circuit board 210. It should be noted that one of skill in the art will recognize that heat sinks 230, 240, 250, 260 could be coupled to individual electronic components without departing from the spirit and-scope of the present invention. Bases 233, 243, 253, 263 of heat sinks 230, 240, 250, 260 are further coupled to corresponding pins 235, 245, 255, 265. Each grouping of pins 235, 245, 255, 265 form an elevation angle that is less than 90 degrees relative to bases 233, 243, 253, 263 of corresponding heat sinks 230, 240, 250, 260. In a certain embodiment of the present invention this elevation angle is 72 degrees, measured from the base. In addition to the elevation angle of pins 235, 245, 255, 265, the bases 233, 243, 253, 263 of corresponding heat sinks 230, 240, 250, 260 are oriented so that adjacent heat sinks differ by 180 degrees. This orientation can be considered a rotation in the plane of the base of each heat sink. For example, heat sink 240 is rotated 0 degrees, while heat sink 250 is rotated 180 degrees with respect to the plane containing the heat sinks. This rotation is measured with respect to a reference angle perpendicular to an edge of component 210.

The differing base orientation of heat sinks 230, 240, 250, 260 in combination with the elevation angles of pins 235, 245, 255, 265 cause airflow 220 to be disrupted as airflow passes over heat sinks 230, 240, 250, 260. This increased turbulence of airflow 220 increases the heat dissipation capability of heat sinks 230, 240, 250, 260. It is noted that although two different orientations are shown for the base of heat sinks 230, 240, 250, 260, and a single elevation angle is shown for pins 235, 245, 255, 265, each heat sink could have a distinct amount of rotation, and each collection of pins could have a distinct elevation angle. Additionally the arrangement of the heat sinks in FIG. 2 is exemplary and is not intended to restrict the scope of the present invention. Heat sinks 230, 240, 250, 260 could be located so that one or more of heat sinks 230, 240, 250, 260 hang over an edge of a component, and one or more of heat sinks 230, 240, 250, 260 are not aligned with respect to an edge of the one or more heat sinks heat sinks 230, 240, 250, 260.

Figure 3:
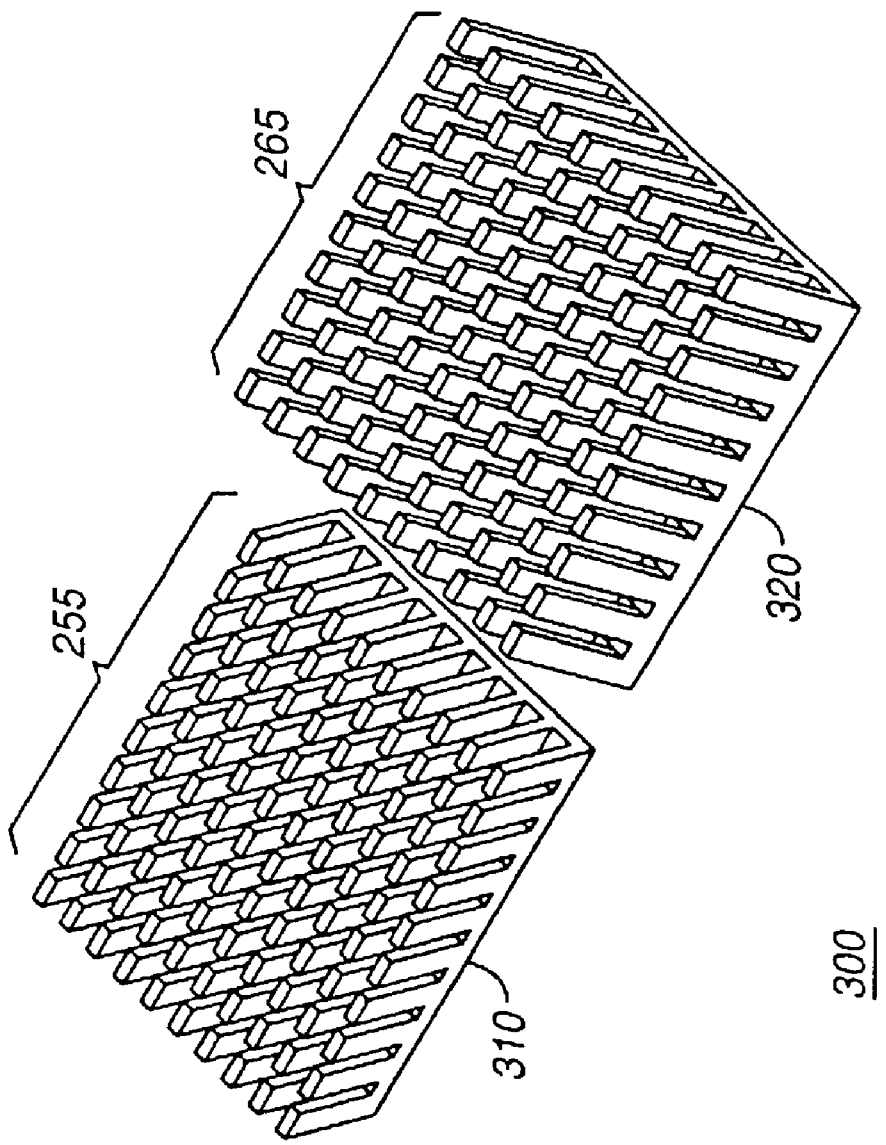
FIG. 3 is a top view of an exemplary pin arrangement of an exemplary heat sink, according to an embodiment of the present invention.

Referring now to. FIG. 3 a top view of an exemplary pin arrangement 300 of the exemplary heat sink of FIG. 2 is shown, according to a certain embodiment of the present invention. FIG. 3 shows pins 255 and 265 coupled to corresponding base 310 and base 320, respectively. Exemplary pin arrangement 300 illustrates that collection of pins 255 has an elevation angle that is the same as an elevation angle of collection of pins 265 and base 310 has an orientation that is the same as the orientation of base 320. It is noted that each collection of pins could have more than one elevation angle without departing from the spirit and scope of the present invention. It is further noted that the pins comprising the collection of pins 255 could have different lengths with respect to base 310.

Figure 6:
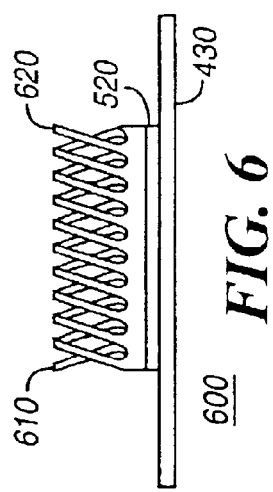
FIG. 6 is a second side view of an exemplary heat sink with pins at more than one angle, according to an embodiment of the present invention.
Figure 4:
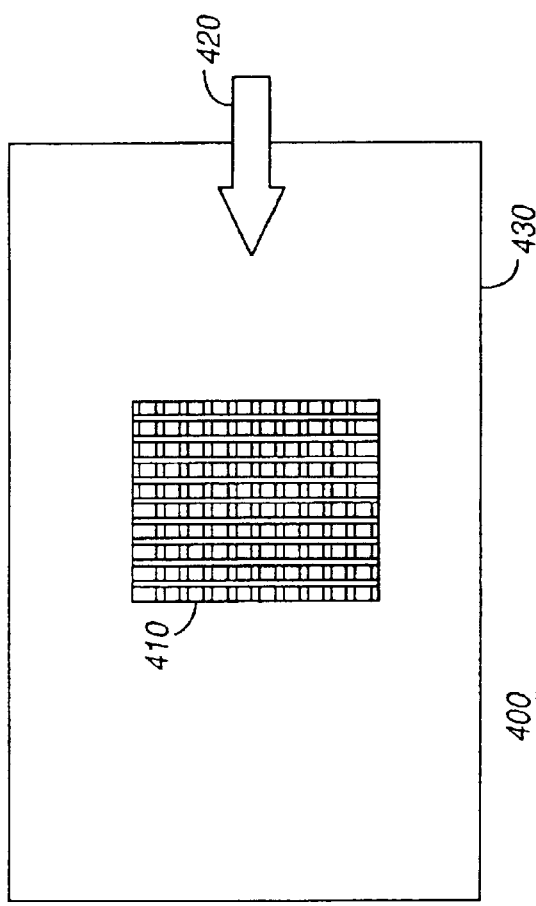
FIG. 4 is a top view of an exemplary heat sink with pins at more than one angle, according to an embodiment of the present invention.
Figure 5:
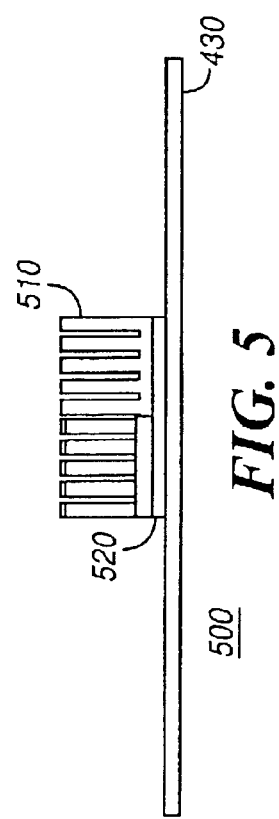
FIG. 5 is a first side view of an exemplary heat sink with pins at more than one angle, according to an embodiment of the present invention.

Referring now to FIG. 4 a top view of an exemplary heat sink 400 with pins at more than one angle is shown, according to a certain embodiment of the present invention. Heat sink 410 is shown coupled to component 430 while an airflow path 420 is shown passing over heat sink 410. Referring now to FIG. 5 a first side view 500 of exemplary heat sink 400 with pins at more than one angle is shown, according to a certain embodiment of the present invention. It is noted that collection of pins 510 appear to have a distinct 90 degree elevation angle with respect to base 520. However, referring now to FIG. 6 a second side view 600 of exemplary heat sink 400 with pins at more than one angle is shown, according to a certain embodiment of the present invention. The second side view 600 is 90 degrees rotated with respect to the first side view 500, and illustrates that collection of pins 510 actually comprises a first subcollection of pins 610 with a first elevation angle, and a second subcollection of pins 620 with a second elevation angle. Thus the spirit and scope of the present invention encompass an embodiment in which a single heat sink contains a collection of pins wherein the pins comprising the collection may have more than one elevation angle with respect to a base element.

In a certain embodiment of the present invention, more than one heat sink is coupled to a single electronic component, and each collection of pins of each heat sink coupled to the electronic component has a single elevation angle, while each heat sink is oriented with 180 degrees of rotation relative to an adjacent heat sink.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. An apparatus for the dissipation of thermal heat, further comprising:
   a first heat sink element, further comprising:
      a first base element of a plurality of base elements, said plurality of base elements coupled to one or more electronic components;
      a first plurality of pins coupled to the first base element, said first plurality of pins having at least a first elevation angle;
   a second heat sink element, further comprising:
      a second base element of the plurality of base elements, oriented with respect to the first base element;
   a second plurality of pins coupled to the second base element, said second plurality of pins having at least a second elevation angle; and
   wherein the orientation of the second base element with respect to the first base element and the first and second elevation angles create airflow turbulence of an airflow over said first and second plurality of pins.

2. The apparatus of claim 1, wherein the first plurality of pins and the second plurality of pins are composed of pins having different lengths.

3. The apparatus of claim 1, wherein the plurality of base elements are not in alignment.

4. The apparatus of claim 1, wherein the first base element is placed on a component of the one or more electronic components with no overhang.

5. The apparatus of claim 1, wherein the first and second elevation angles are one elevation angle, and the orientation of the second base element with respect to the first base element differs by substantially 180 degrees.

6. The apparatus of claim 1, wherein the one or more components operate in a forced air condition.

7. The apparatus of claim 1, wherein the first elevation angle and the second elevation angle is substantially 72 degrees.

8. The apparatus of claim 1, wherein the first base element and the second base element are coupled to an electronic component of the one or more electronic components.

9. The apparatus of claim 8, wherein the first and second elevation angles are one elevation angle, and the orientation of the second base element with respect to the first base element differ by substantially 180 degrees.

* * * * *